United States Patent [19]
Lee et al.

[11] Patent Number: 5,936,478
[45] Date of Patent: Aug. 10, 1999

[54] VOLTAGE-CONTROLLED OSCILLATOR INCLUDING A STABILIZED RING OSCILLATOR

[75] Inventors: Chien-Hsiung Lee, Hsinchu; Yuh-Min Lin, Taipei, both of Taiwan

[73] Assignee: Davicom Semiconductor, Inc., Hsin Chu, Taiwan

[21] Appl. No.: 09/032,583

[22] Filed: Feb. 27, 1998

[30] Foreign Application Priority Data

Oct. 1, 1997 [TW] Taiwan ................................. 86216639

[51] Int. Cl.$^6$ ....................................................... H03B 5/02
[52] U.S. Cl. ........................ 331/57; 331/177 R; 331/186
[58] Field of Search ................................ 331/57, 177 R, 331/185, 186

[56] References Cited

U.S. PATENT DOCUMENTS 5,638,014   6/1997   Kurita ...................................... 327/141

*Primary Examiner*—Siegfried H. Grimm
*Attorney, Agent, or Firm*—Knobbe, Martens, Olson & Bear, LLP

[57] ABSTRACT

A voltage controlled oscillator (VCO) is provided which can minimize the frequency shift and phase disturbance caused by noise in the input voltage to the VCO. The VCO includes a voltage-to-current converting unit, receiving the input voltage, for generating a bias voltage. A ring-oscillating unit including an odd number of cascaded ring oscillator stages (ROSC) is coupled to the voltage-to-current converting unit for generating an oscillating signal. A bias unit is coupled to the ring-oscillating unit for generating a stable DC bias voltage for the ring-oscillating unit. A current adjustment unit is coupled to the voltage-to-current converting unit and the ring-oscillating unit, which can generate a working current in response to the bias voltage for the ring-oscillating unit. By feeding the bias voltage and the DC bias voltage to the current adjustment unit, a current feedback loop is formed which serves as a current-sampling shunt-mixing circuit producing a stable current output that allows the VCO to produce an oscillating signal with a stable frequency.

5 Claims, 9 Drawing Sheets

VOLTAGE-CONTROLLED OSCILLATOR INCLUDING A STABILIZED RING OSCILLATOR

BACKGROUND OF THE INVENTION

1. Field of the Invention

This invention relates to voltage-controlled oscillators (VCO), and more particularly, to a voltage-controlled oscillator which is specifically used in a phase-locked loop (PLL) circuit, capable of minimizing the phase disturbance in the output frequency of the PLL circuit due to noise input to the VCO.

2. Description of Related Art

The voltage-controlled oscillator (VCO) is a core device in conventional phase-locked loop (PLL) circuits. With integrated circuits getting more complicated, the noise level in the source voltage is usually high. This noise, when input to the VCO in the PLL circuit, would cause a phase disturbance to the output frequency, causing the output frequency to be inaccurate.

FIG. 1 is a schematic block diagram of a conventional PLL circuit. As shown, the PLL circuit includes a first frequency divider 10, a phase comparator 12, a loop filter 14, a VCO 16, and a second frequency divider 18. The first frequency divider 10 receives an external clock signal $V_S$ and generates an output clock signal $V_I$ whose frequency is 1/M of the frequency of the input clock signal $V_S$. The phase comparator 12 has two input ends: a first input end receiving the clock signal $V_I$ and a second input end receiving a reference signal $V_C$ which is a feedback signal obtained by processing the output $V_O$ of the PLL circuit through the second frequency divider 18. The phase comparator 12 compares $V_I$ with $V_C$ to thereby generate an output signal $V_D$ in such a manner that, when $V_I > V_C$, the output signal $V_D$ is a high voltage level representing a first binary value, for example 1; and when $V_I < V_C$, the output signal $V_D$ is a low voltage level representing a second binary value, for example 0. the output signal $V_D$ is therefore a binary data stream which is transferred subsequently to the loop filter 14 where it is integrated to obtain an analog output voltage $V_G$. This analog output voltage $V_G$ is transferred to the VCO 16 to cause the VCO 16 to output an oscillating signal $V_O$ with a frequency proportional to the magnitude of the voltage $V_G$. This oscillating signal $V_O$ is taken as the output of the PLL circuit. Also, the oscillating signal $V_O$ is fed back through the second frequency divider 18, where it is decreased in frequency. The output of the second frequency divider 18 then serves as the above-mentioned reference voltage $V_C$ to the phase comparator 12.

Assume that the variation of the voltage $V_G$ input to the VCO 16 is $\Delta V$ and the variation of the output frequency f in response to $\Delta V$ is $\Delta f$, then the gain G of the VCO 16 is defined as follows:

$$G = \Delta f / \Delta V$$

Conventional PLL circuits have a typical gain of about 100 MHz/V (megahertz/volt). When a noise appears in the input to the VCO, for example a 10 mV (millivolt) noise, it will cause the output frequency to have a phase disturbance of 5 mV×100 MHz/V=500 kHz (kilohertz). This high phase disturbance is undesired.

SUMMARY OF THE INVENTION

It is therefore a primary objective of the present invention to provide a voltage-controlled oscillator which can minimize the phase disturbance causes by noise input to the VCO in the PLL circuit.

In accordance with the foregoing and other objectives of the present invention, an improved voltage-controlled oscillator is provided. The voltage-controlled oscillator includes the following constituent elements:

(a) a voltage-to-current converting unit, receiving the input voltage, for generating a bias voltage;

(b) a ring-oscillating unit, coupled to said voltage-to-current converting unit, for generating the oscillating signal;

(c) a bias unit, coupled to said ring-oscillating unit, for generating a DC bias voltage for said ring-oscillating unit; and (d) a current adjustment unit coupled to said voltage-to-current converting unit and said ring-oscillating unit, said current adjustment unit being capable of generating a working current in response to the bias voltage for said ring-oscillating unit, said working current and said DC bias voltage driving said ring-oscillating unit to generate the oscillating signal taken as output of said voltage-controlled oscillator.

The foregoing VCO can provide a stable DC bias voltage to the ROSC stages in the ring-oscillating unit so that the ROSC stages will not produce frequency shift and phase disturbance due to noises in the input voltage source. Moreover, the current-sampling shunt-mixing configuration can produce a stable current output that allows the VCO to produce an oscillating signal with a stable frequency.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENT

Figure 1:
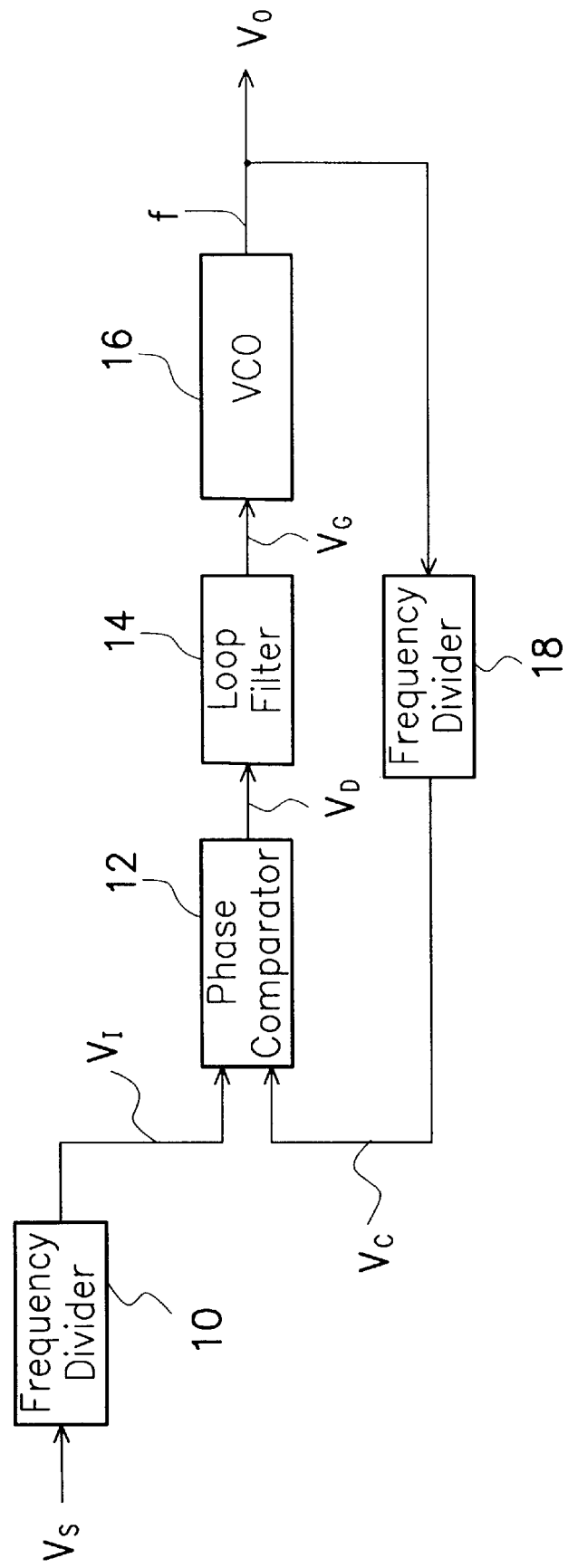
FIG. 1 is a schematic block diagram of a conventional PLL (phase-locked loop) circuit.
Figure 2:
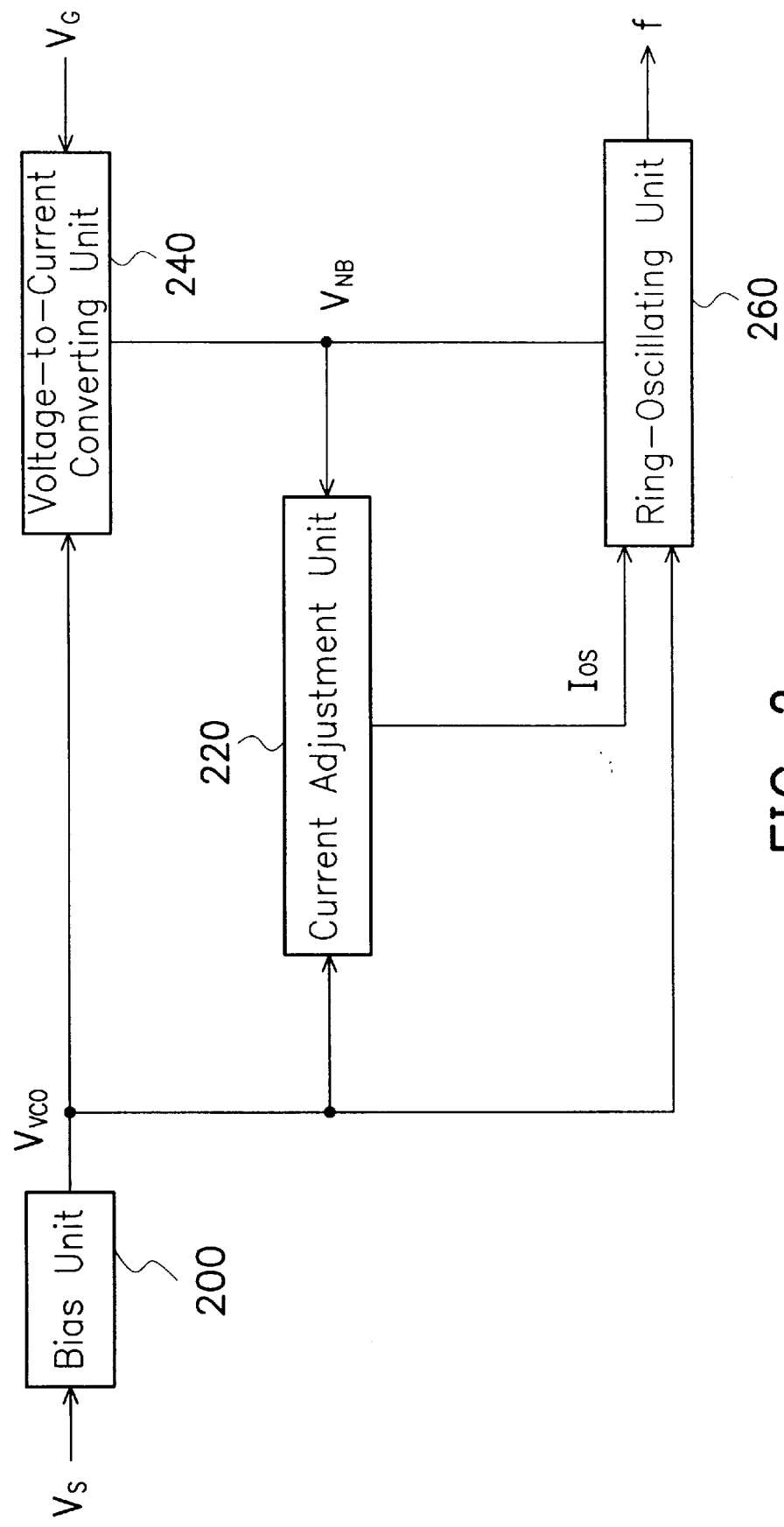
FIG. 2 is a schematic block diagram of the voltage-controlled oscillator (VCO) according to the invention.

FIG. 2 is a circuit diagram of the voltage-controlled oscillator according to the invention. The circuit of FIG. 2 can be used as the VCO 16 in the PLL circuit of FIG. 1.

The VCO 16 can generate an oscillating signal $V_O$ with a frequency f proportional to the magnitude of the input voltage $V_G$.

As shown, the preferred embodiment of the VCO of the invention is MOS-based, which includes a bias unit 200, a current adjustment unit 220, a voltage-to-current converting unit 240, and a ring-oscillating unit 260. The bias unit 200 is used to generate a stably fixed DC bias voltage $V_{VCO}$ for the voltage-to-current converting unit 240 and the ring-oscillating unit 260. The current adjustment unit 220 is used to generate a working current $I_{OS}$ for the ring-oscillating unit 260. The voltage-to-current converting unit 240 can generate a bias voltage $V_{NB}$ in response to an input potential $V_G$. The bias voltage $V_{NB}$ is applied to the current adjustment unit 220 and the ring-oscillating unit 260 to thereby cause the ring-oscillating unit 260 to generate an output frequency f.

Figure 3:
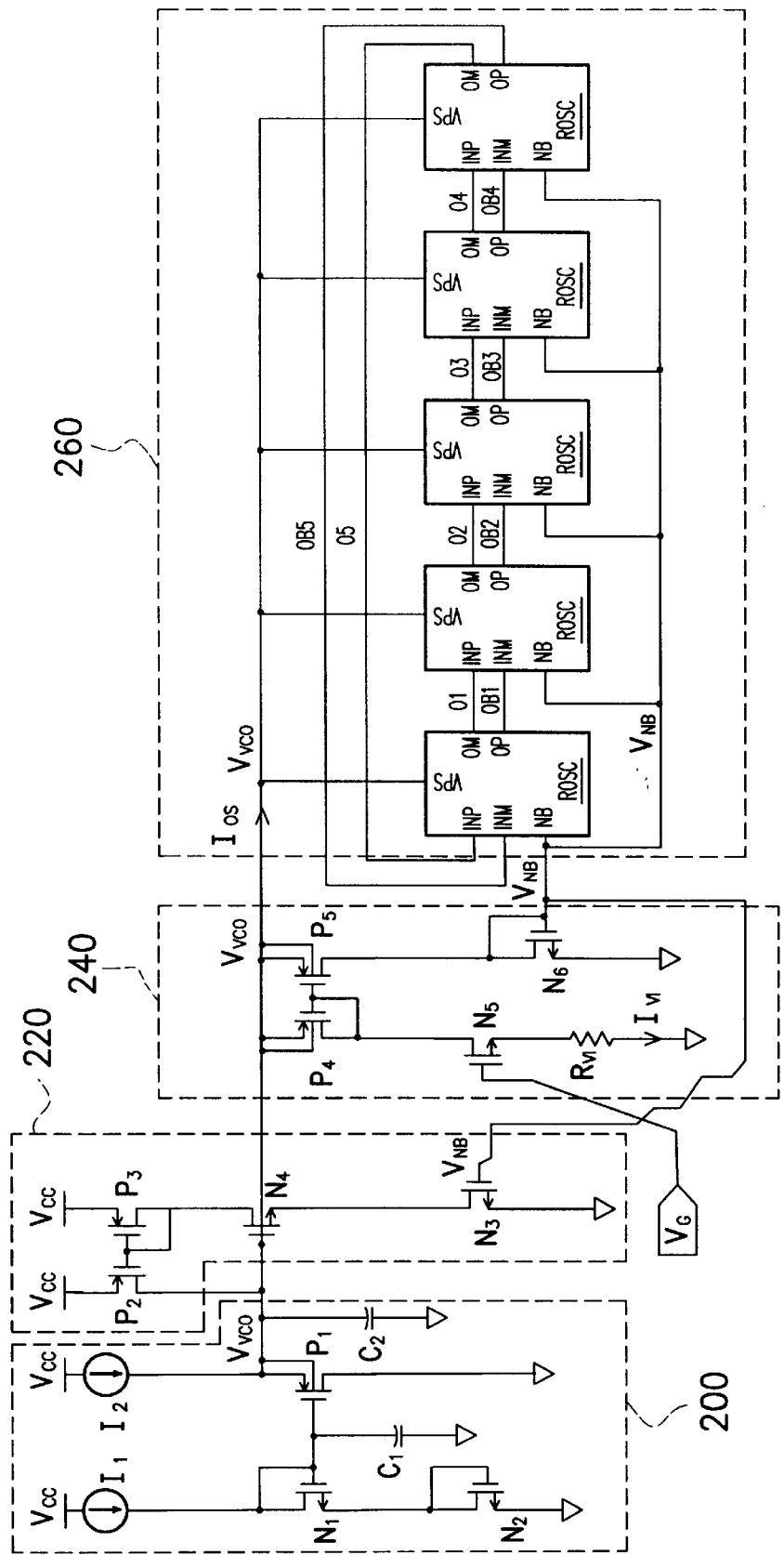
FIG. 3 is a detailed circuit diagram of the VCO according to the invention.

FIG. 3 shows a detailed circuit diagram of the VCO of FIG. 2. As shown, the bias unit 200 includes a first current source $I_1$, a second current source $I_2$, a pair of NMOS transistors $N_1$, $N_2$, a PMOS transistor $P_1$, and a pair of capacitors $C_1$, $C_2$. The current adjustment unit 220 includes a pair of PMOS transistors $P_2$, $P_3$, and a pair of NMOS transistors $N_3$, $N_4$. The voltage-to-current converting unit 240 includes a pair of PMOS transistors $P_4$, $P_5$, a pair of NMOS transistors $N_5$, $N_6$, and a converting resistor $R_{VI}$. The ring-oscillating unit 260 includes an odd number of cascaded ring-oscillator stages (ROSC), for example 5 in the case of FIG. 3.

In FIG. 3, the input voltage $V_G$ is connected to the gate of the NMOS transistor $N_5$ in the voltage-to-current converting unit 240. The source of the NMOS transistor $N_5$ is connected to the converting resistor $R_{VI}$ which has one end connected to the ground. The drain of the NMOS transistor $N_5$ is connected to both of the drain and gate of the PMOS transistor $P_4$ and also to the gate of the PMOS transistor $P_5$. The gate of the PMOS transistor $P_4$ and the gate of the PMOS transistor $P_5$ are tied together in such a manner that the two PMOS transistors $P_4$, $P_5$ in combination constitute a current mirror. The drain of the PMOS transistor $P_5$ is connected to both of the drain and gate of the NMOS transistor $N_6$. The source of the NMOS transistor $N_6$ is connected to the ground. The PMOS transistor $P_4$, the NMOS transistor $N_5$, and the converting resistor $R_{VI}$ in combination constitute a voltage-to-current converting means which can convert the input voltage $V_G$ to a current $I_{VI}$ as follows:

$$I_{VI}=(V_G-V_{GSN5})/R_{VI}$$

where $V_{GSN5}$ is the potential difference between the gate and source of the NMOS transistor $N_5$, which is typically about 0.8 V to 1.2 V (volt).

Since the PMOS transistor $P_4$ and the PMOS transistor $P_5$ form a current mirror, the PMOS transistor $P_5$ can output a current substantially equal in magnitude to $I_{VI}$. This current causes the gate of the NMOS transistor $N_6$ to output a potential $V_{NB}$ which serves as a bias voltage. The bias voltage $V_{NB}$ is connected to the bias input port NB of each of the ROSCs in the ring-oscillating unit 260. With this circuit arrangement, when the input voltage $V_G$ rises due to a noise, the current $I_{VI}$ is correspondingly raised, thereby raising the bias voltage $V_{NB}$. This causes the working current $I_{OS}$ of the ring-oscillating unit 260 to be correspondingly raised, thus increasing the oscillating frequency f of the ring-oscillating unit 260. The output frequency f of the ring-oscillating unit 260 is thus dependent on the magnitude of the bias voltage $V_{NB}$.

The current adjustment unit 220 receives the bias voltage $V_{NB}$ from the voltage-to-current converting unit 240. When the input voltage $V_G$ is raised, the bias voltage $V_{NB}$ is correspondingly raised. The bias voltage $V_{NB}$ is connected to the gate of the NMOS transistor $N_3$ in the current adjustment unit 220. The source of the NMOS transistor $N_3$ is connected to the ground, and the drain of the same is connected to the source of the NMOS transistor $N_4$. The drain of the NMOS transistor $N_4$ is connected to both of the drain and gate of the PMOS transistor $P_3$ and also to the gate of the PMOS transistor $P_2$. The drain of the PMOS transistor $P_2$ is connected to the gate of the NMOS transistor $N_4$. The source of the PMOS transistor $P_3$ and the source of the PMOS transistor $P_2$ are both connected to a DC voltage source $V_{CC}$. The gate of the PMOS transistor $P_2$ and the gate of the PMOS transistor $P_3$ are tied together in such a manner that the two PMOS transistors $P_2$, $P_3$ in combination constitute a current mirror.

With the foregoing circuit arrangement, when the current flowing through the NMOS transistor $N_3$ is increased, the output current of the PMOS transistor $P_2$ is correspondingly increased. The drain of the PMOS transistor $P_2$ is connected to the input port VPS of each of the ROSCs in the ring-oscillating unit 260, thereby allowing the output current of the PMOS transistor $P_2$ to serve as a working current $I_{OS}$ for the ring-oscillating unit 260 when the bias voltage $V_{NB}$ is raised.

On the other hand, when the input voltage $V_G$ drops, the bias voltage $V_{NB}$ is correspondingly lowered. This causes the output current of the PMOS transistor $P_2$ (i.e., the working current $I_{OS}$) to be correspondingly lowered, thereby causing the output frequency f of the ring-oscillating unit 260 to be correspondingly lowered.

In the bias unit 200, the first current source $I_1$ is connected to both of the drain and gate of the NMOS transistor $N_1$, and also to the first capacitor $C_1$ and the gate of the PMOS transistor $P_1$. The source of the NMOS transistor $N_1$ is connected to both of the drain and gate of the NMOS transistor $N_2$. The source of the NMOS transistor $N_2$ is connected to the ground. The second current source $I_2$ is coupled to the source of the PMOS transistor $P_1$ whose drain and source are connected respectively to the ground and the second capacitor $C_2$. The other end of the second capacitor $C_2$ is connected to the ground. The source of the PMOS transistor $P_1$ produces a DC bias voltage $V_{VCO}$ which is a stable voltage output that is maintained at about 3 V to 4 V. In the prior art of FIG. 1, since the port VPS is directly coupled to receive the DC input $V_{CC}$, frequency shift and phase disturbance will occur whenever the DC input contains noises from external sources.

In the foregoing VCO of the invention, the configuration of feeding the bias voltage $V_{NB}$ from the voltage-to-current converting unit 240 to the current adjustment unit 220 coupled to the bias unit 200 constitutes a current feedback loop which serves as a so-called current-sampling shunt-mixing circuit that can produce a stable current output.

Figure 4:
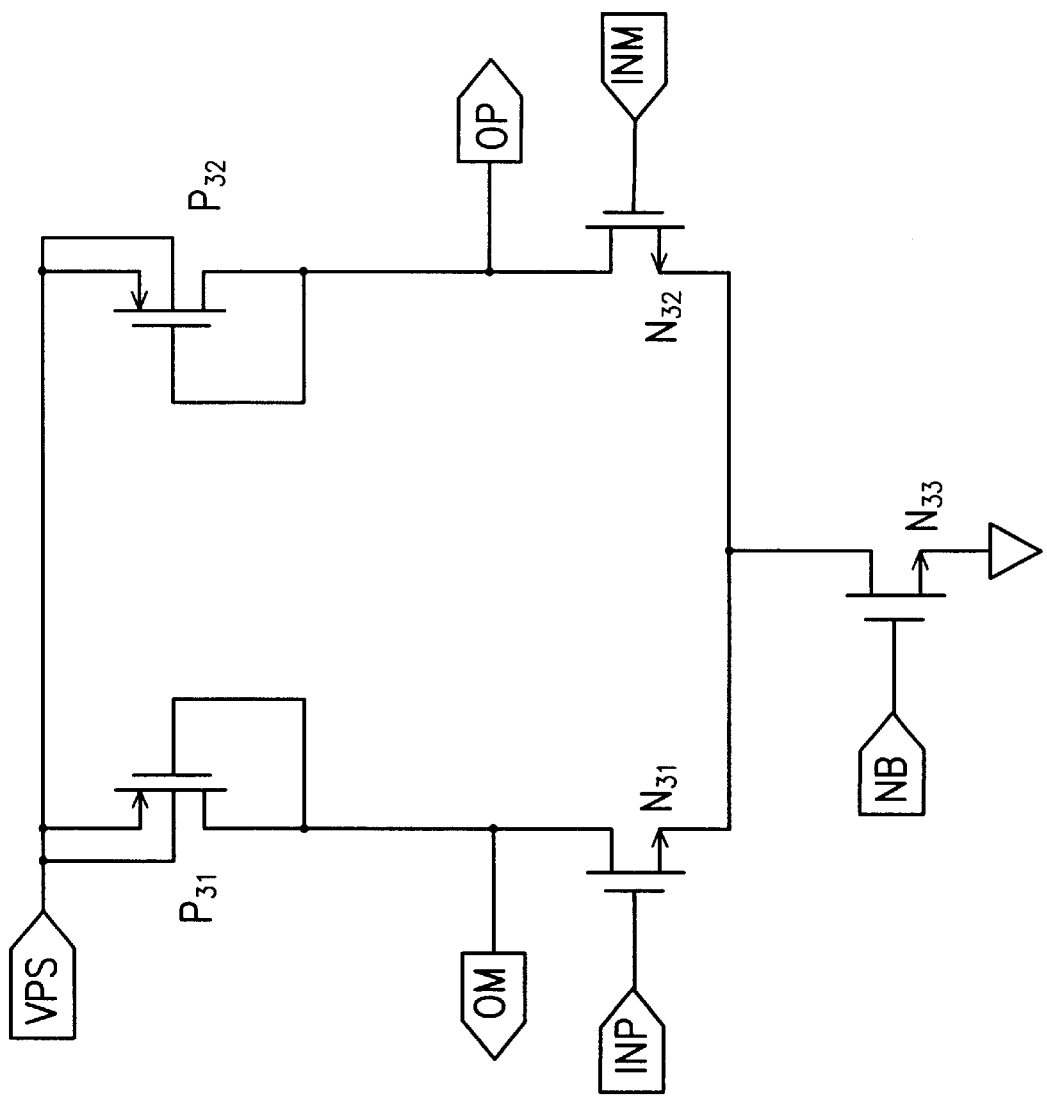
FIG. 4 is a circuit diagram of a ring-oscillator stage (ROSC) used in a ring-oscillating unit in the VCO of FIG. 3.

FIG. 4 is a circuit diagram of each of the ROSC stages in the ring-oscillating unit 260 shown in FIG. 3. As shown, each ROSC includes a pair of PMOS transistors $P_{31}$, $P_{32}$, and three NMOS transistors $N_{31}$, $N_{32}$, $N_{33}$. The input port VPS of the ROSC is connected to both of the source of the PMOS transistor $P_{31}$ and the source of the PMOS transistor $P_{32}$. The drain of the PMOS transistor $P_{31}$ is connected to the drain of the NMOS transistor $N_{31}$. The drain of the PMOS transistor $P_{31}$ outputs a first oscillating signal OM which is transferred to the INP port of the next ROSC (see FIG. 3). Similarly, the drain of the PMOS transistor $P_{32}$ is connected to the drain of the NMOS transistor $N_{32}$. The drain of the PMOS transistor $P_{32}$ outputs a second oscillating signal OP which is transferred to the INM port of the next ROSC (see FIG. 3). The first and second oscillating signals OM, OP are equal in frequency but with a phase difference of 180°. The gate of the NMOS transistor $N_{31}$ is connected to the INP port to receive the oscillating signal OM from the previous ROSC; and the gate of the NMOS transistor $N_{32}$ is connected to the INM port to receive the oscillating signal OP from the previous ROSC. The drain of the NMOS transistor $N_{33}$ is connected to both of the source of the NMOS transistor $N_{31}$ and the source of the NMOS transistor $N_{32}$. The gate of the NMOS transistor $N_{33}$ is connected to the NB port to receive the bias voltage $V_{NB}$.

An example of the response of the DC bias voltage $V_{VCO}$ to a variation in the input voltage $V_G$ is illustrated and depicted in the following with reference to the graphs shown in FIGS. 5 through 9.

Figure 5:
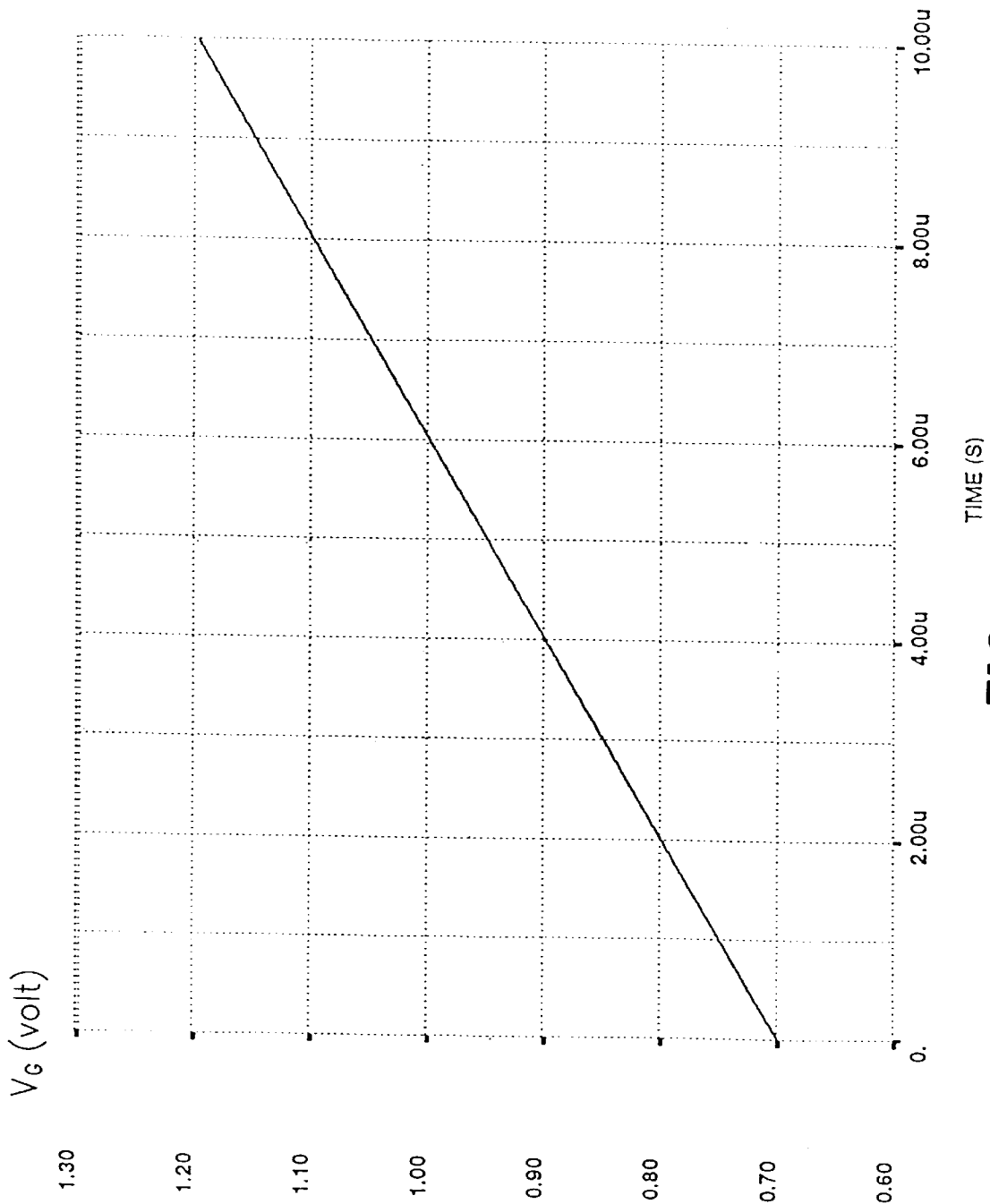
FIG. 5 through FIG. 9 are graphs, showing various characteristics of the VCO of the invention.

FIG. 5 is a graph showing an example of a variation of the input voltage $V_G$ to the VCO of the invention with respect to time. In the case of FIG. 5, the input voltage $V_G$ is varied linearly from 0.75 V to 1.2 V during the time from 1.00 u to 10.00 u (unit of time).

Figure 6:
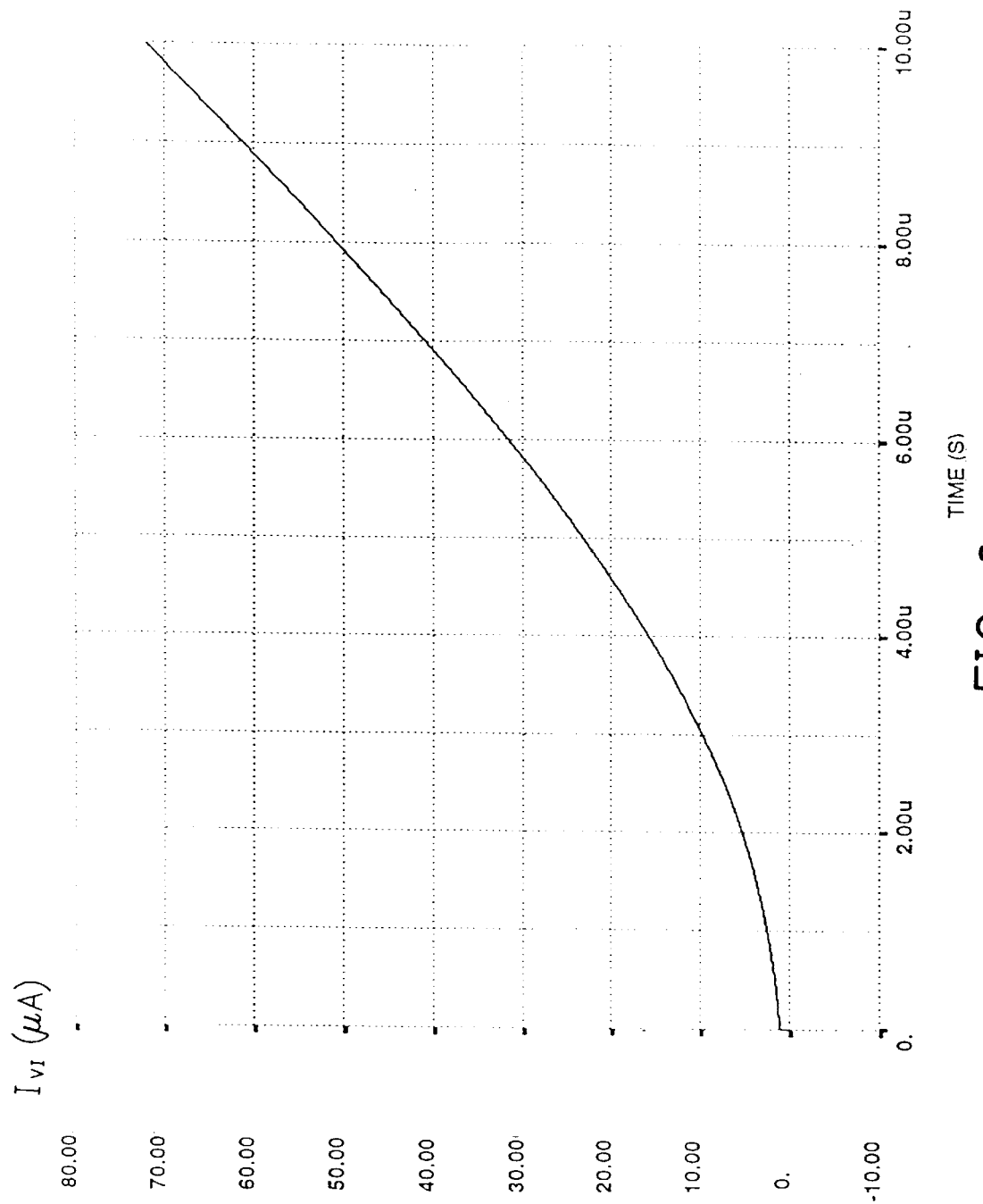

From actual testing, the variation of the working current $I_{VI}$ in response to the variation of the input voltage $V_G$ shown in FIG. 5 is illustrated in FIG. 6. As shown, during the period the input voltage $V_G$ is varied linearly from 0.75 V to 1.2 V, the working current $I_{VI}$ is correspondingly varied along a curve from about 2.7 $\mu$A (microampere) to about 69.0 $\mu$A.

Figure 7:
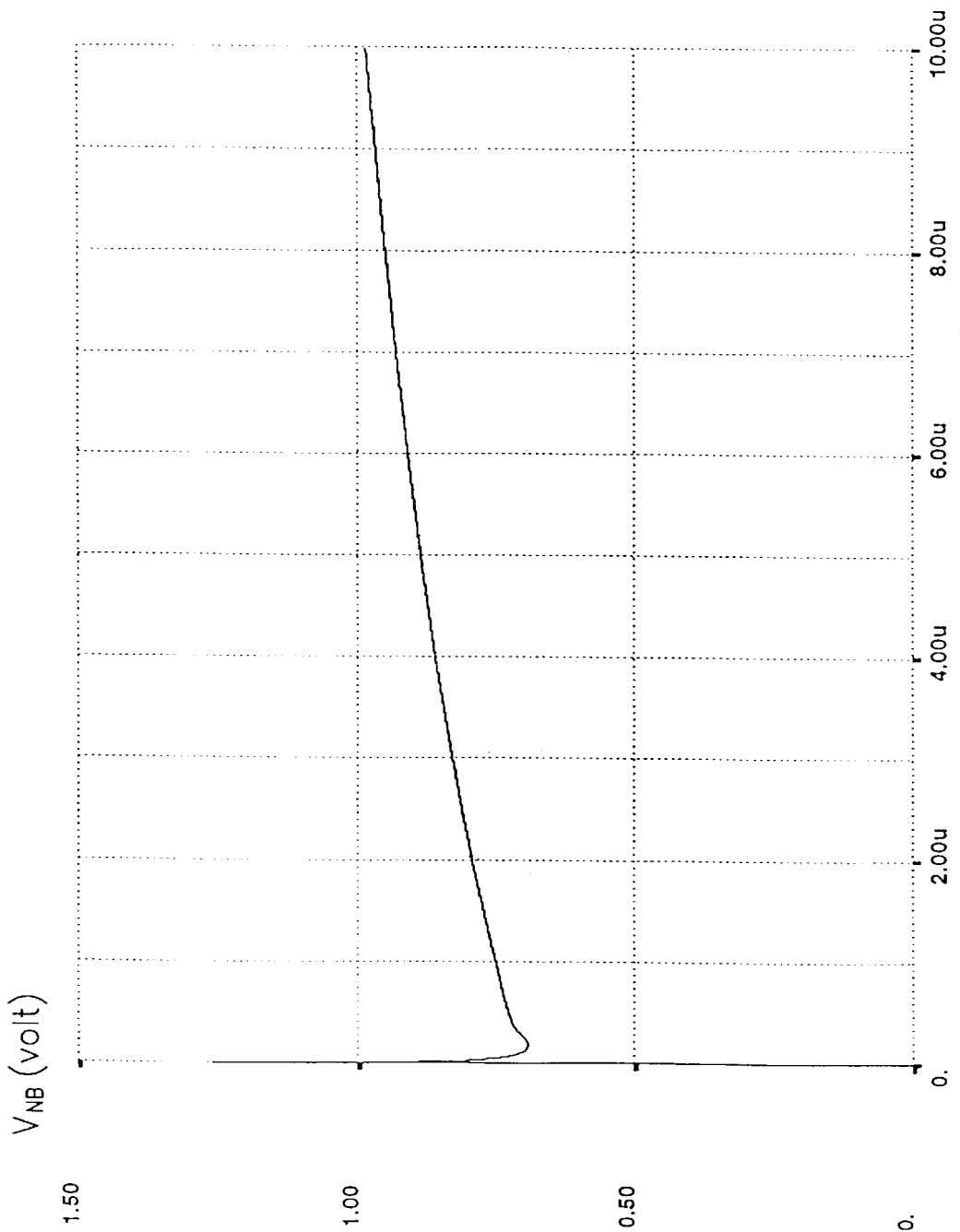

Further, the variation of the bias voltage $V_{NB}$ in response to the variation of the input voltage $V_G$ shown in FIG. 5 is illustrated in FIG. 7. As shown, during the period the input voltage $V_G$ is varied linearly from 0.75 V to 1.2 V, the bias voltage $V_{NB}$ is varied substantially linearly from 0.75 V to 0.98 V.

Figure 8:
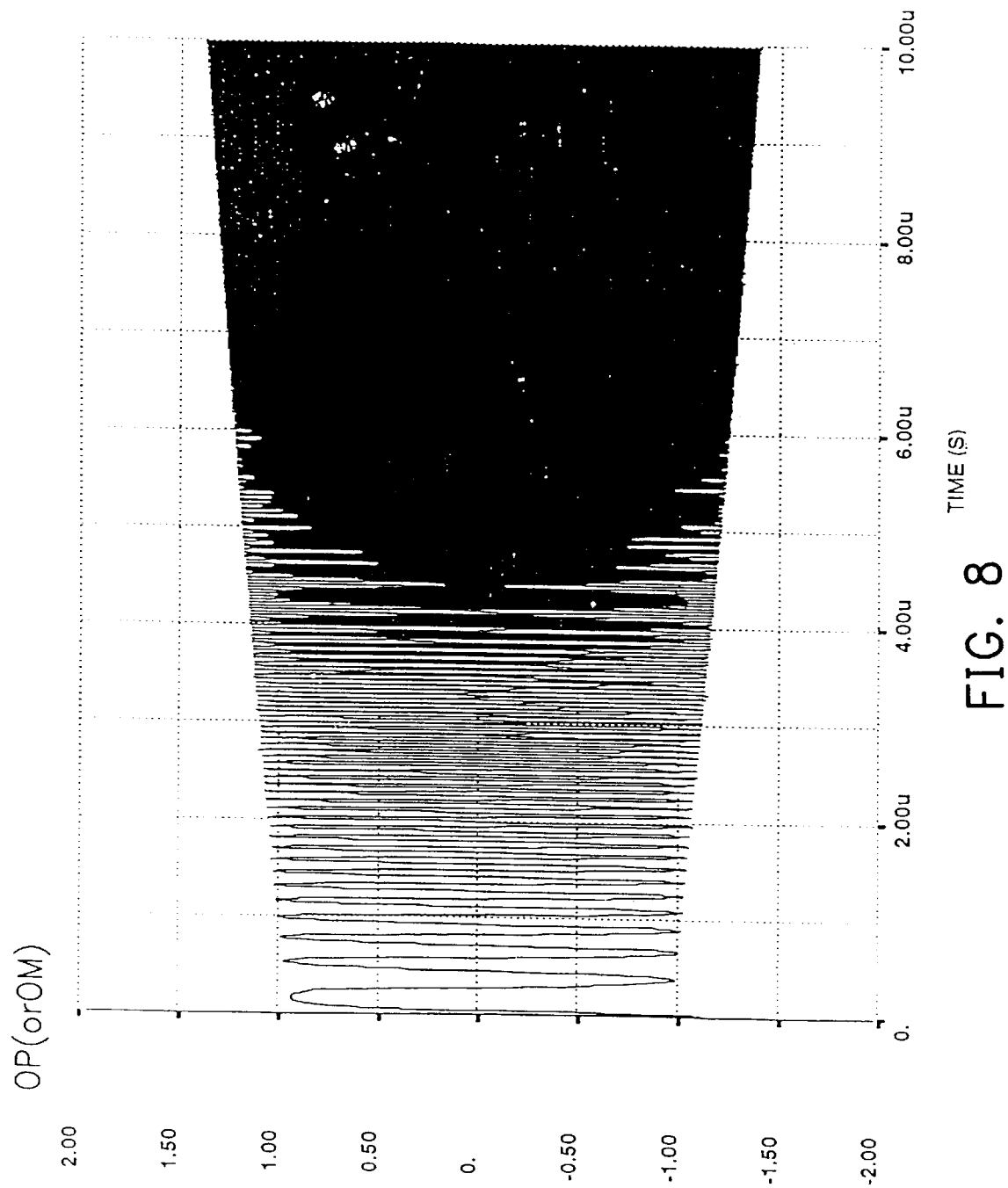

FIG. 8 is a graph, showing the variation of either of two output oscillating signals OP, OM from each ROSC in the ring-oscillating unit 260 in response to the variation of the input voltage $V_G$ shown in FIG. 5.

Figure 9:
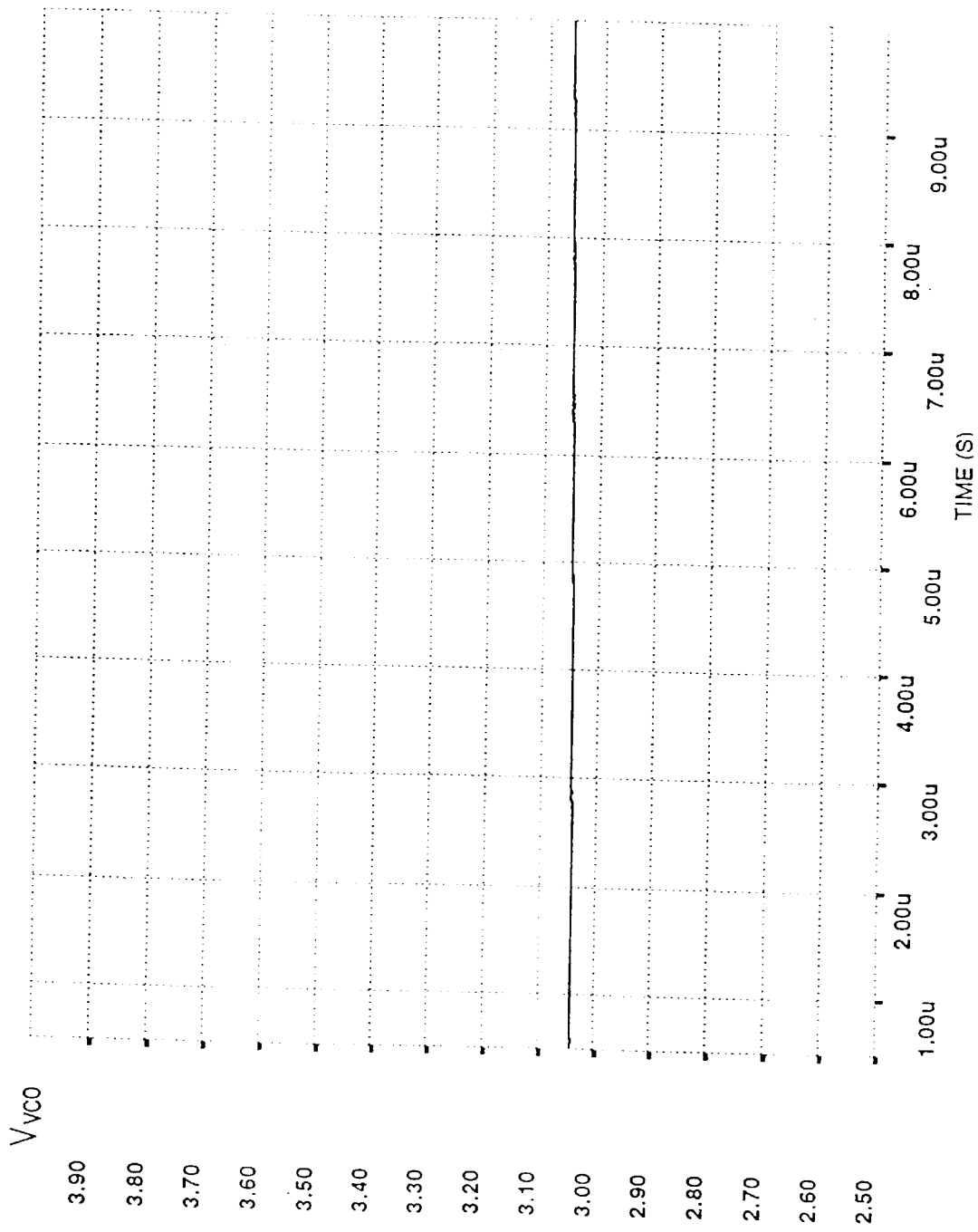

Further, the variation of the DC bias voltage $V_{VCO}$ in response to the variation of the input voltage $V_G$ shown in FIG. 5 is illustrated in FIG. 9. As shown, during the period the input voltage $V_G$ is varied linearly from 0.75 V to 1.2 V, the DC bias voltage $V_{VCO}$ is varied from about 3.044 V to 3.059 V. The difference is only about 15 mV, which is substantially small to cause significant phase disturbance as in the prior art.

In conclusion, the VCO of the invention can provide a stable DC bias voltage to the ROSCs so that the ROSCs will not produce frequency shift and phase disturbance due to noises in the input voltage source. Moreover, the current-sampling shunt-mixing configuration can produce a stable current output that allows the VCO to produce an oscillating signal with a stable frequency.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A voltage-controlled oscillator for generating an oscillating signal with a frequency proportional to the magnitude of an input voltage, comprising:

a voltage-to-current converting unit, receiving the input voltage, for generating a bias voltage;

a ring-oscillating unit, coupled to said voltage-to-current converting unit, for generating the oscillating signal;

a bias unit, coupled to said ring-oscillating unit, for generating a DC bias voltage for said ring-oscillating unit; and a current adjustment unit coupled to said voltage-to-current converting unit and said ring-oscillating unit, said current adjustment unit being capable of generating a working current in response to the bias voltage for said ring-oscillating unit, said working current and said DC bias voltage driving said ring-oscillating unit to generate the oscillating signal taken as output of said voltage-controlled oscillator.

2. The voltage-controlled oscillator of claim 1, wherein said bias unit includes:

a first current source;

a second current source;

a first NMOS transistor whose drain and gate are connected together to said first current source;

a second NMOS transistor whose drain and gate are connected together to the source of said first NMOS transistor and whose source is connected to the ground;

a first PMOS transistor whose source is connected to the second current source, whose gate is connected to both of the gate and drain of said first NMOS transistor, and whose drain is connected to the ground, the output from the source of said first PMOS transistor being taken as the DC bias voltage;

a first capacitor having a first end connected to the ground and a second end connected to the gate of said first PMOS transistor and both of the gate and drain of said first NMOS transistor; and a second capacitor having a first end connected to the ground and a second end connected to the source of said first PMOS transistor.

3. The voltage-controlled oscillator of claim 2, wherein said current adjustment unit includes:

a third NMOS transistor whose gate is connected to the bias voltage and whose source is connected to the ground;

a fourth NMOS transistor whose source is connected to the drain of said third NMOS transistor;

a second PMOS transistor whose drain is connected to the gate of said fourth NMOS transistor, whose source is connected to the DC voltage source; and a third PMOS transistor whose gate and drain are connected together to the drain of said fourth NMOS transistor, whose gate and drain are connected together to the gate of said second PMOS transistor, and whose source is connected to the DC voltage source;

wherein said second and third PMOS transistors in combination form a first current mirror capable of generating the working current.

4. The voltage-controlled oscillator of claim 3, wherein said voltage-to-current converting unit includes:

a fifth NMOS transistor coupled to receive the input voltage;

a converting resistance having a first end connected to the source of said fifth NMOS transistor and a second end connected to the ground;

a fourth PMOS transistor whose gate and drain are connected together to the drain of said fifth NMOS transistor and whose source is connected to the DC bias voltage;

a fifth PMOS transistor whose gate is connected to both of the gate and drain of said fourth PMOS transistor and whose source is connected to the DC bias voltage; said fifth PMOS transistor and said fourth PMOS transistor in combination constituting a second current mirror; and a sixth NMOS transistor whose gate and drain are connected together to the drain of said fifth PMOS transistor and whose source is connected to the ground, the gate of said sixth NMOS outputting the bias voltage.

5. The voltage-controlled oscillator of claim 1, wherein said ring-oscillating unit includes an odd number of serially cascaded ring-oscillator stages.

* * * * *